(12) United States Patent
Kawaguchi et al.

(10) Patent No.: US 9,257,318 B2
(45) Date of Patent: Feb. 9, 2016

(54) OPERATION METHOD FOR VACUUM PROCESSING APPARATUS

(71) Applicant: HITACHI HIGH-TECHNOLOGIES CORPORATION, Tokyo (JP)

(72) Inventors: Michinori Kawaguchi, Tokyo (JP); Satomi Inoue, Tokyo (JP); Yoshiro Suemitsu, Tokyo (JP); Keita Nogi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 345 days.

(21) Appl. No.: 13/975,612

(22) Filed: Aug. 26, 2013

(65) Prior Publication Data

US 2014/0294555 A1  Oct. 2, 2014

(30) Foreign Application Priority Data

Mar. 29, 2013  (JP) ................................. 2013-070938

(51) Int. Cl.
*G06F 7/00*  (2006.01)
*H01L 21/677*  (2006.01)

(52) U.S. Cl.
CPC ................................ *H01L 21/67745* (2013.01)

(58) Field of Classification Search
CPC .............................................. H01L 21/67745
USPC ........................................................ 700/218
See application file for complete search history.

(56) References Cited

U.S. PATENT DOCUMENTS

| 2005/0015174 | A1* | 1/2005 | Arai | G05B 19/41865 700/121 |
|---|---|---|---|---|
| 2007/0282477 | A1* | 12/2007 | Schmidt | G05B 19/41865 700/101 |
| 2009/0076648 | A1* | 3/2009 | Numakura | H01L 21/67276 700/228 |
| 2011/0004334 | A1* | 1/2011 | Kobayashi | G05B 19/4189 700/112 |
| 2011/0144792 | A1 | 6/2011 | Nakata et al. | |
| 2011/0217148 | A1 | 9/2011 | Nakata et al. | |
| 2011/0218662 | A1 | 9/2011 | Nakata et al. | |

FOREIGN PATENT DOCUMENTS

| JP | 2011-124496 A | 6/2011 |
|---|---|---|
| JP | 2011/181750 A | 9/2011 |
| JP | 2011/181751 A | 9/2011 |

* cited by examiner

*Primary Examiner* — Kyle Logan
(74) *Attorney, Agent, or Firm* — Mattingly & Malur, PC (57) ABSTRACT

A method for operating a vacuum processing apparatus, the vacuum processing apparatus including: a plurality of cassette stands on which a cassette capable of housing a plurality of wafers therein can be placed; a plurality of vacuum processing vessels each having a processing chamber arranged therein, wherein the wafer is arranged and processed in the processing chamber; and at least one transport robot transporting the wafer on a transport path between either one of the plurality of cassettes and the plurality of vacuum processing vessels, the vacuum processing apparatus sequentially transporting in a predetermined transport order the plurality of wafers from either one of the plurality of cassettes to a predetermined one of the plurality of vacuum processing vessels and processing the plurality of wafers. The method includes a number determining step, a remaining-time determining step and a transport order skip step.

5 Claims, 9 Drawing Sheets

START
↓
STEP 1: ACQUIRE TRANSPORT INFORMATION — 501
↓
STEP 2: CONFIRM NUMBER LIMIT — 502
↓
STEP 3: CONFIRM REMAINING PROCESSING TIME — 503
↓
STEP 4: TRANSPORT ORDER SKIP PROCESS — 504
↓
END

FIG. 6

| No | PORT | SLOT | EU No |
|----|------|------|-------|
| 1  | 1    | 1    | EU 3  |
| 2  | 2    | 1    | EU 1  |
| 3  | 3    | 1    | EU 4  |
| 4  | 4    | 1    | EU 2  |
| 5  | 1    | 2    | EU 3  |
| 6  | 2    | 2    | EU 1  |
| 7  | 3    | 2    | EU 4  |
| 8  | 4    | 2    | EU 2  |
| 9  | 1    | 3    | EU 3  |
| 10 | 2    | 3    | EU 1  |
| 11 | 3    | 3    | EU 4  |
| 12 | 4    | 3    | EU 2  |
| 13 | 1    | 4    | EU 3  |
| 14 | 2    | 4    | EU 1  |

| No. | PORT | SLOT | EU No. | |
|---|---|---|---|---|
| 1 | 1 | 1 | EU 3 | 713 |
| 2 | 2 | 1 | EU 1 | |
| 3 | 3 | 1 | EU 4 | BEING |
| 4 | 4 | 1 | EU 2 | TRANSPORTED |
| 5 | 1 | 2 | EU 3 | |
| 6 | 2 | 2 | EU 1 | |
| 7 | 3 | 2 | EU 4 | |
| 8 | 4 | 2 | EU 2 | 714 |
| 9 | 1 | 3 | EU 3 | |
| 10 | 2 | 3 | EU 1 | WAITING FOR |
| 11 | 3 | 3 | EU 4 | TRANSPORT |
| 12 | 4 | 3 | EU 2 | |
| 13 | 1 | 4 | EU 3 | |
| 14 | 2 | 4 | EU 1 | |

| EU1 PROCESSING CONDITIONS | PROCESSING TIME |
|---|---|
| PRETREATMENT AGING | 300 SECONDS |
| PRODUCT PROCESSING | 30 SECONDS |

901 (label for table)

OPERATION METHOD FOR VACUUM PROCESSING APPARATUS

The present application claims priority from Japanese application JP2013-070938 filed on Mar. 29, 2013, the content of which is hereby incorporated by reference into this application.

BACKGROUND OF THE INVENTION

The present invention is directed to methods for operating a vacuum processing apparatus. In particular, the present invention relates to a method for operating a vacuum processing apparatus comprising: a plurality of coupled vacuum transport chambers; a plurality of coupled vacuum processing vessels; and a plurality of processing chambers; wherein a substrate-like sample, such as a semiconductor wafer, is arranged and processed in the processing chamber inside the vacuum processing vessel, and wherein the vacuum transport chamber comprises a plurality of coupled vacuum processing vessels.

In a semiconductor device processing step, there are various processes, such as etching, ashing, and film-forming processes, and various vacuum processing apparatuses corresponding to these processes are widely used. In these vacuum processing apparatuses, a reduction in cost and an improvement in productivity are required. As a productivity index, there is a process throughput (the number of wafers processed per unit time), and increasing this throughput value and improving a production efficiency per apparatus are the important subjects.

As a related art for the above-described vacuum processing apparatus, for example, as described in JP-A-2011-124496 (corresponding to U.S. Patent Publication No. 2011/144792), a vacuum processing apparatus of a linear tool is known, wherein a plurality of transport robots are arranged in a transport mechanical unit, to which a processing module is coupled, and an subject to be processed is delivered and received between the plurality of transport robots. In this related art, in the case where there are a plurality of transport paths on which the subject to be processed, such as a wafer, is transported, a technique is disclosed for selecting and determining a transport path, on which the highest throughput can be obtained, by comparing the throughputs of the respective transport paths to each other.

Moreover, as described in JP-A-2011-181750 (corresponding to U.S. Patent Publication No. 2011/218662), there is known a vacuum processing apparatus including a load lock chamber, in which a sample to be processed is housed and which transports the sample between a portion on an atmospheric side and a decompressed and vacuumed portion by increasing or decreasing a pressure between an atmospheric pressure and a predetermined degree of vacuum, the apparatus comprising a plurality of processing chambers, in which a predetermined process is performed on the sample to be processed; a plurality of transport mechanical units each of which includes a vacuum robot delivering and receiving the sample to be processed; a plurality of transport intermediate units that couple the transport mechanical units and relay and transport the sample to be processed. In this related art, the vacuum processing apparatus includes a control unit that controls delivering/receiving and relaying/transporting of the sample to be processed. Here, the control unit includes: a connection distance calculation unit that calculates a connection distance from the load lock chamber to each of the transport mechanical units; a transport-operation count calculation unit that calculates a number of times of transport operations of the sample to be processed to each of the plurality of processing chambers connected to the vacuum robot; a transport operation order calculation unit that calculates a transport operation order of the samples to be processed in each of the vacuum robots, based on the number of times of transport operations to each of the plurality of processing chambers and each of the plurality of transport intermediate units performed by the vacuum robot; and a processing chamber allocation unit that performs allocation of each of the plurality of processing chambers to which the sample to be processed, whose transport operation order is calculated, is transported.

With such a configuration, in a vacuum processing apparatus, wherein a plurality of transport robots are arranged in a transport mechanical unit to which a processing chamber is coupled and wherein a sample to be processed is delivered and received between a plurality of transport robots, the further the transport robot located from the load lock, the larger the number of transport operations to the processing chambers is set. Moreover, JP-A-2011-181750 (corresponding to U.S. Patent Publication No. 2011/218662) discloses that an efficient transport control is performed by performing a transport operation based on a destination determination unit and an operation control rule to set the number of times of continuous transport operations to the processing chambers as small as possible and set the number of times of continuous transport operations to intermediate chambers to an odd number as much as possible.

Furthermore, as described in JP-A-2011-181751 (corresponding to U.S. Patent Publication No. 2011/217148), there is known a vacuum processing apparatus comprising: a processing chamber for performing a predetermined process on a subject to be processed; a transport mechanical unit comprising a vacuum robot delivering and receiving the subject to be processed; a transport intermediate unit that couples the transport mechanical units and relay and transport the subject to be processed; and a control unit that controls delivering/receiving and relaying/transporting of the subject to be processed, wherein the control unit determines a method for transporting the subject to be processed to each of the processing chamber and the transport intermediate unit based on a time required for the processing chamber to process the subject to be processed in the processing chamber.

In this related art, with such a configuration, there is disclosed a technique for performing an efficient transport control in a vacuum processing apparatus of a linear tool, wherein a plurality of transport robots are arranged in a transport mechanical unit, to which a processing chamber is coupled, and a subject to be processed is delivered and received among the plurality of vacuum robots, the vacuum processing apparatus including a plurality of control methods, wherein it is determined, based on a processing time of the subject to be processed, whether a transport robot is rate-controlled or a processing chamber is rate-controlled, thereby switching to a control method corresponding to the portion to be rate-controlled and performing an efficient transport control.

SUMMARY OF THE INVENTION

The above-described related arts do not take into full consideration the following points and pose a problem. That is, the above-described related arts do not take into full consideration a case where, at a place (station), including a cassette or a hoop having a sample, such as a wafer, housed therein, the place where a sample is held and stays inside a vacuum processing apparatus, a standby time (waiting time) for transport to a target station increases.

Therefore, there is no consideration as to the problem that the number of samples to be transported per unit time, i.e., the so-called throughput, decreases significantly and thus the processing efficiency of the whole vacuum processing apparatus is deteriorated. In particular, the following point has not been taken into consideration. In the vacuum processing apparatus, in the case where a plurality of processes requiring a long time and a plurality of processes requiring a short time are performed in parallel, even if a transport condition providing a desired high throughput is selected and the above describe processes are performed, in a vacuum processing vessel in which the process requiring a short time is performed, a waiting time at the start of the process and/or a waiting time until a processed wafer is carried out is generated, thus deteriorating the throughput.

Moreover, in a vacuum processing apparatus, in which each of a plurality of samples is sequentially transported to each of a plurality of vacuum processing vessels and processed in the relevant processing vessel, the following problem occurs. In the case where a plurality of conditions for a process applied to each sample requiring a long time and for a process applied to each sample requiring a short time are mixed, even if each sample is sequentially transported in a predetermined order from a cassette, in which the sample is housed, to the vacuum side of the apparatus, a large difference is generated between a waiting time for transport and a waiting time for processing at least one station of a plurality of stations on a transport path after a sample is transported to a target vacuum processing vessel, in which the sample is processed, and until the sample returns to the original location of an original cassette. As a result, a desired throughput cannot be obtained in spite that samples are transported in accordance with a transport order and path for the samples, the transport order and path being determined in advance so as to provide a desired throughput.

The present invention has been made in view of the above circumstances, and provides a method for operating a vacuum processing apparatus capable of increasing a throughput or an efficiency in processing samples.

The aforesaid object of the present invention is attained, for example, by a method for operating a vacuum processing apparatus, the vacuum processing apparatus comprising: a plurality of cassette stands on which a cassette capable of housing a plurality of wafers therein can be placed; a plurality of vacuum processing vessels each having a processing chamber arranged therein, wherein the wafer is arranged and processed in the processing chamber; and at least one transport robot transporting the wafer on a transport path between either one of the plurality of cassettes and the plurality of vacuum processing vessels, the vacuum processing apparatus sequentially transporting in a predetermined transport order the plurality of wafers from either one of the plurality of cassettes to a predetermined one of the plurality of vacuum processing vessels and processing the plurality of wafers, the method including:

a number determining step of, before any one of the plurality of wafers is carried out from the cassette, determining whether or not a number of the wafers being present and currently being transported on the transport path between the cassette and one of the plurality of vacuum processing vessels, in which a relevant wafer is scheduled to be processed, is equal to or less than a predetermined value;

a remaining-time determining step of determining whether or not a total of a remaining processing time of the wafer being scheduled to be processed and being present in the one vacuum processing vessel and a processing time of the wafer being present and currently being transported on the transport path is equal to or less than a predetermined value; and a transport order skip step of, if a condition in the number determining step or in the remaining-time determining step is not satisfied, performing the number determining step and the remaining processing time determining step on the wafers after the any one wafer in accordance with the transport order, and newly specifying the wafer first satisfying the condition in these steps, as a wafer to be carried out from the cassette in place of the arbitrary one wafer, wherein the newly specified wafer is transported from the cassette, in which this wafer is housed, to the predetermined vacuum processing vessel and processed.

Other objects, features and advantages of the invention will become apparent from the following description of the embodiments of the invention taken in conjunction with the accompanying drawings.

DETAILED DESCRIPTION OF THE EMBODIMENT

Hereinafter, an embodiment of the present invention will be described using the accompanying drawings.

Hereinafter, the embodiment of the present invention will be described using FIG. 1 to FIG. 10. This embodiment is a vacuum processing apparatus, in which a substrate-like sample, such as a semiconductor wafer, used for manufacturing a semiconductor device is arranged in a processing chamber inside a vacuum vessel and processed using plasma formed in the processing chamber.

Figure 1:
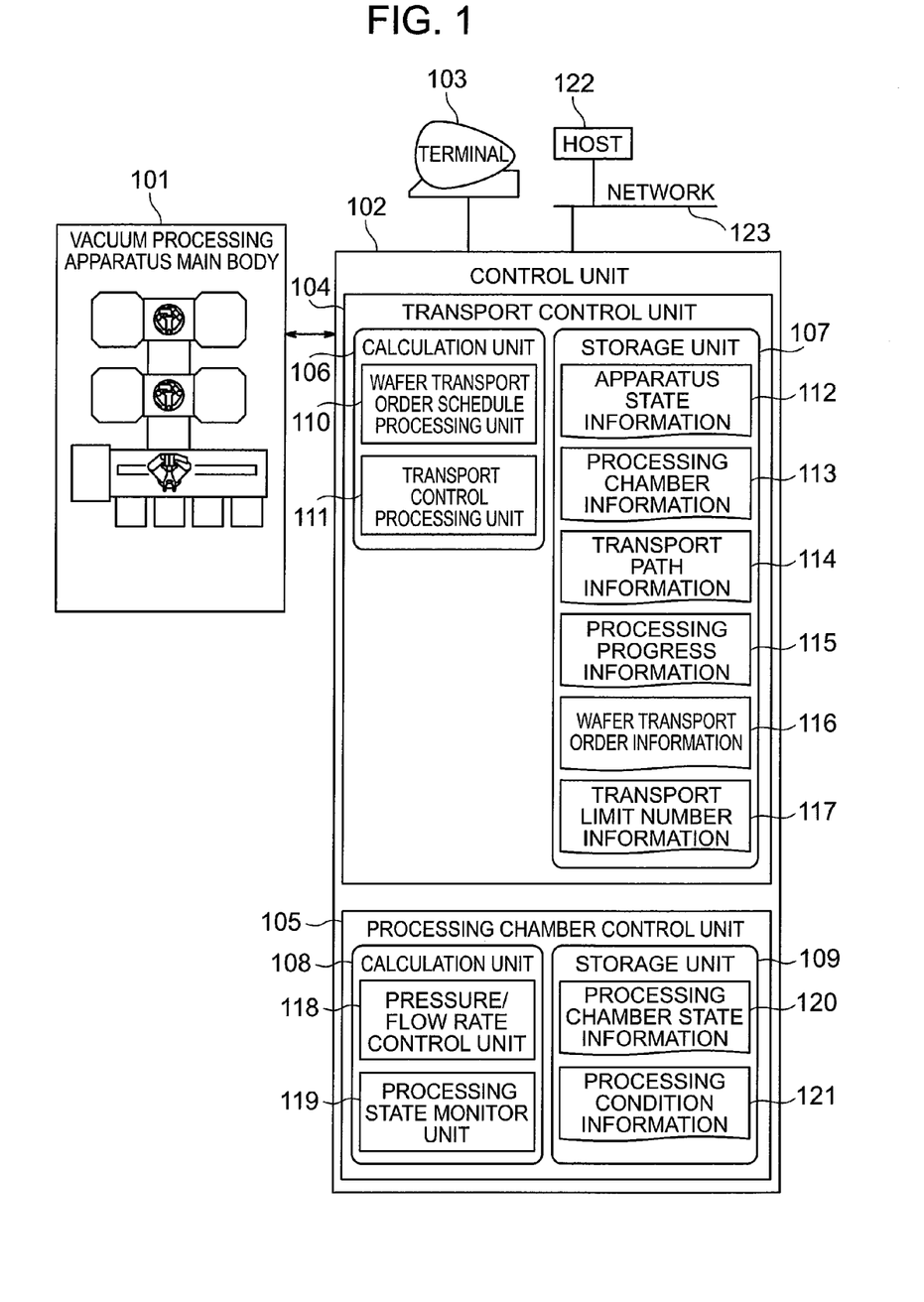
FIG. 1 is a view schematically showing an outline of the configuration of a vacuum processing apparatus according to an embodiment.

FIG. 1 is a view schematically showing an outline of the configuration of the vacuum processing apparatus according to this embodiment. In this view, the vacuum processing apparatus roughly comprises a vacuum processing apparatus main body 101, a control unit 102, and a terminal 103.

The vacuum processing apparatus main body 101 comprises: a vacuum processing vessel that is a vacuum vessel having a processing chamber therein for performing processes, such as etching, ashing, and/or film-forming processes, with respect to a semiconductor wafer (hereinafter, wafer) that is a sample to be processed; a transport mechanism having therein a robot arm that transports a wafer; and a cassette stand, on which a cassette is to be placed, the cassette being a vessel arranged along a front face of the vacuum processing apparatus and being capable of housing therein wafers.

The control unit 102 is configured so as to be able to communicate with the vacuum processing apparatus main body 101 by a communication unit via a wired or wireless medium, receives a signal indicative of a state of the vacuum processing apparatus main body 101, and calculates a signal to command the vacuum processing apparatus main body 101 to perform a corresponding operation and transmits the same. The control unit 102 of the embodiment roughly includes a transport control unit 104 that adjusts a wafer transport operation, and a processing chamber control unit 105 that adjusts the processing of a wafer in the processing chamber inside the vacuum processing vessel.

The transport control unit 104 includes: an interface unit that transmits and receives a signal between the transport control unit 104 and a communication unit; a calculation unit 106 that detects predetermined information from a received signal and furthermore calculates a command signal to command the operation of the vacuum processing apparatus main body 101 using a predetermined algorithm; and a storage unit 107, in which the algorithm for the calculation unit 106 to calculate information or a command signal is stored and also information indicative of a state of the vacuum processing apparatus main body 101 is stored. The calculation unit 106 is a semiconductor device including an arithmetic logical unit, such as a microprocessor unit, and includes a wafer transport schedule processing unit 110 that determines a transport order of wafers housed inside a cassette placed on the cassette stand on the front side of the vacuum processing apparatus main body 101, and a transport control processing unit 111 that controls transport processing in accordance with a determined transport order. These wafer transport schedule processing units 110 and transport control processing unit 111 may be separate devices, or may be separate arithmetic logical units of one and the same device, or alternatively one and the same arithmetic logical unit of one and the same device may act as these units.

Moreover, the storage unit 107 comprises an external storage device, such as a RAM (Random Access Memory), a ROM (Read Only Memory), a hard disk drive, or a removable disk drive, which is located outside the control units 102 and is communicatively connected thereto. In this embodiment, the information stored in the storage unit 107 includes apparatus state information 112, processing chamber information 113, transport path information 114, processing progress information 115, wafer transport order information 116, and transport limit number information 117.

The processing chamber control unit 105 includes a calculation unit 108 that adjusts the operation of processing in the processing chamber and a storage unit 109 for storing conditions of this processing. The calculation unit 108 is a semiconductor device, such as a microprocessor unit having an arithmetic logical unit therein, and includes a pressure/flow rate control unit 118 that controls the pressure or flow rate of gas inside the processing chamber, and a processing state monitor unit 119 for detecting a state during processing of a sample. The pressure/flow rate control unit 118 and the processing state monitor unit 119 may be separate devices, or may be separate arithmetic logical units of one and the same device, or alternatively one and the same arithmetic logical unit of one and the same device may act as these units.

The storage unit 109, as with the storage unit 107, comprises an external storage device, such as a RAM (Random Access Memory), a ROM (Read Only Memory), a hard disk drive, or a removable disk drive, which is located outside the control units 102 and is communicatively connected thereto. The information stored in the storage unit 107 includes processing chamber state information 120 indicative of a state inside the processing chamber that is detected using the processing state monitor unit 119; and processing condition information 121 indicative of the conditions (the pressure, flow rate, types, composition ratio of gases, the intensity of an electric field or magnetic field supplied to the processing chamber, the power, values of temperature and a distribution thereof, and the like) of processing inside the processing chamber that are set in advance for each wafer to be processed.

The terminal 103 is a device communicatively connected to the control unit 10 via a wired or wireless medium, wherein a user can display a state of the vacuum processing apparatus main body 101, and set the operation to drive the vacuum processing apparatus main body 101 and the control performed by the control unit 102, including the processing conditions and/or transport conditions in the processing chamber. The terminal 103 includes a display device, such as a liquid crystal or a monitor using a CRT, capable of displaying the above-described information, and input devices, such as a keyboard for inputting data and a command and a mouse.

Moreover, the vacuum processing apparatus main body 101 of this embodiment, for each building of a clean room or the like in which the vacuum processing apparatus main body 101 is installed, or for each floor or room in which the vacuum processing apparatus main body 101 is installed, is connected, via a network using a wired or wireless communication line 123, to a host 122 that is an upper controller arranged to detect the operation and/or state of processing of each vacuum processing apparatus and to command each vacuum processing apparatus to operate. The host 122, as with the control unit 102, is the so-called computer including a communication interface, an arithmetic unit, and a storage device, and in accordance with an algorithm described in a software that is stored in advance in the storage device, operates a plurality of vacuum processing apparatus main bodies 101 in parallel, and autonomously adjusts the manufacturing of a semiconductor device.

Figure 2:
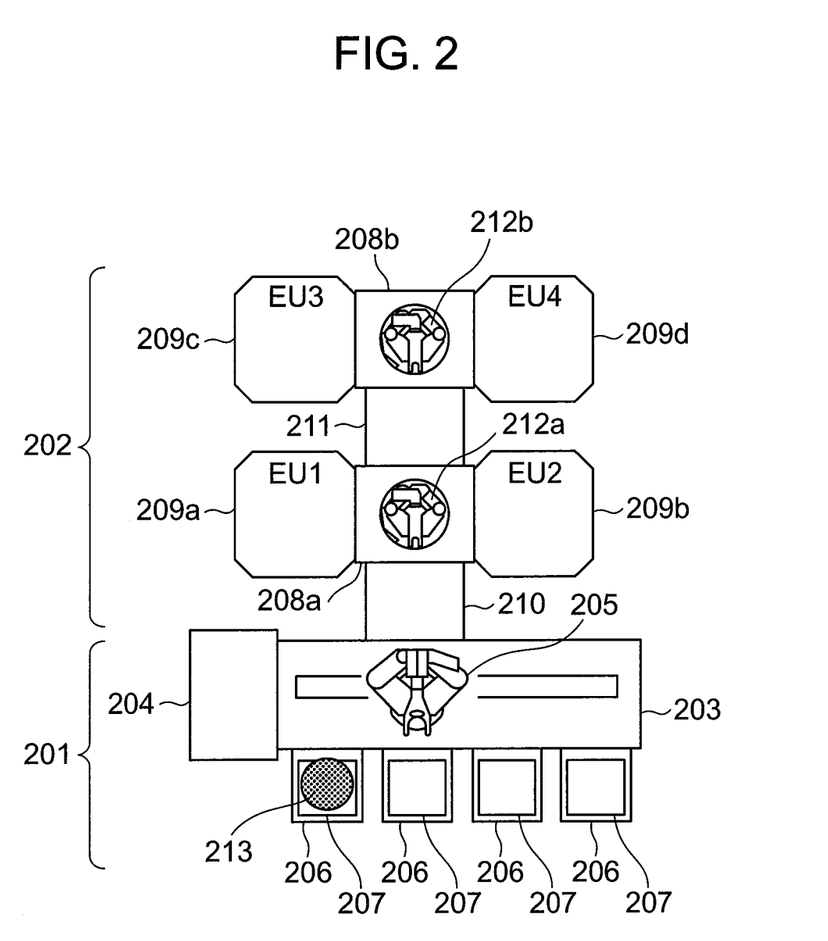
FIG. 2 is a top view schematically showing an outline of the configuration of a vacuum processing apparatus main body of the embodiment shown in FIG. 1.

Next, the vacuum processing apparatus main body 101 is described using FIG. 2. FIG. 2 is a top view schematically showing an outline of the configuration of the vacuum processing apparatus main body of the embodiment shown in FIG. 1.

The vacuum processing apparatus of this embodiment is roughly divided into an atmosphere-side section 201 that is a front (lower side in the view) portion of the vacuum processing apparatus and transports under atmospheric pressure a wafer 213 that is a sample to be processed, and a vacuum side section 202 that is a back (upper side in the view) portion of the vacuum processing apparatus and is also a portion, the inside of which is already decompressed to a predetermined degree of vacuum and in which the wafer 213 is transported and processed and thereafter transported to an original path. The atmosphere-side section 201 and the vacuum side section 202 are coupled by a lock chamber 210, which is a vacuum vessel capable of housing the wafer 213 therein and which is capable of increasing or decreasing the pressure therein between an atmospheric pressure or a pressure of a value approximated thereto and the above-described predetermined degree of vacuum or a pressure of a value approximated thereto.

The atmosphere-side section 201 includes: a plurality of load ports 206 arranged on the front side (lower side in the view) of an enclosure having a transport chamber, the inside of which is set to an atmospheric pressure or a pressure of a value approximated thereto and in which the wafer 213 is transported, the plurality of load ports 206 including a cassette stand, on the upper surface of which a carrier 207 that is a cassette capable of housing a plurality of wafers 213 therein is set; and an aligner 204, to which the wafer 213 is transported and which aligns the location of the center of the wafer 213 and a direction from the center to a cutout or notch formed in advance at an outer edge portion of the wafer 213 with a predetermined location and a predetermined direction, respectively. In the transport chamber arranged inside the enclosure, filtered atmosphere is forced to flow from the above toward the bottom, and the load port 206 forms a mini-environment 203 that is partitioned from the external atmosphere.

Moreover, at a predetermined height location in a side wall on the back side of the enclosure, the lock chamber 210 is communicatively coupled to the mini-environment 203. The lock chamber 210 and the mini-environment 203 are communicated to each other or hermetically sealed by a gate valve that is arranged and opens or blocks between the lock chamber 210 and the mini-environment 203. In the inside of the mini-environment 203 of this embodiment, by setting the pressure of the inside slightly higher than the external atmosphere, dusts from the outside of the load port 206 are prevented from mixing in.

In the inside of the mini-environment 203, there is arranged an atmospheric robot 205 that is a robot arm to transport the wafer 213 between the carrier 207, the aligner 204, and the lock chamber 210. The atmospheric robot 205 includes a plurality of arms each having a plurality of beam-like members coupled at both ends thereof by a joint part and having at an end thereof a hand part, on which the wafer 213 is placed and held, wherein each arm extends and contracts by rotation of the joint part, and carries in the wafer 213 or carries out the received wafer 213 with respect to a desired target.

The vacuum side section 202 includes: processing units 209a, 209b, 209c, and 209d each including a removable vacuum processing vessel, in which processes, such as etching and ashing processes, are performed with respect to the wafer 213; and vacuum transport chambers 208a, 208b, and an intermediate chamber 211. The vacuum side section 202 of the embodiment includes the lock chamber 210.

The vacuum transport chambers 208a and 208b are transporting spaces inside the vacuum vessels with a shape, the plane shape of which is rectangular or a shape approximated to an extent that it can be regarded as rectangular, wherein the wafer 213 is transported under a pressure of the transporting chamber set to a predetermined degree of vacuum. In the insides of the respective vacuum transport chambers 208a and 208b, there are arranged vacuum robots 212a and 212b, respectively, which are robot arms expanding and contracting while placing and holding the wafer 213 on the upper surface of the hand arranged at its tip under a decompressed pressure.

The hand of the vacuum robot 212a, for example, along with the extension and contraction operations of the arm, places onto its upper surface the unprocessed wafer 213, which is stored in the lock chamber 210, and extracts the same and then contracts to carry out the same into the vacuum transport chamber 208a. After turning the hand and the arm toward the processing unit 209a, the hand of the vacuum robot 212a again extends to carry in the wafer 213 to above the upper surface of the sample stage arranged in the processing chamber inside the processing unit 209a. On the contrary, after the processed wafer 213 held above the sample stage inside the processing unit 209a is carried out into the vacuum transport chamber 208a by the extension and contraction operations, the hand and the arm of the vacuum robot 212a can turn toward the lock chamber to perform the carrying-in operation.

The intermediate chamber 211 of this embodiment is a storage space inside a vessel having therein a storage unit capable of housing a plurality of wafers with a vertical a gap therebetween. It is arranged between the side face of the vessel of the vacuum transport chamber 208a located backward of the lock chamber 210 and coupled thereto and the side face of the vessel of the vacuum transport chamber 208b arranged backward of the vacuum transport chamber 208a, and is coupled to the vacuum transport chamber 208a and the vacuum transport chamber 208b. The intermediate chamber 211 is a place where the unprocessed wafer 213 is temporarily housed before being transported to the vacuum transport chamber 208b from the lock chamber 210 or where the processed wafer 213 is temporarily housed before being transported to the lock chamber 210 from the vacuum transport chamber 208b.

The configuration of the vacuum processing apparatus main body 101 is not limited to the one shown in this view, and the number of load ports may be less than four or may be greater than four. Moreover, also in the vacuum side section 202, the apparatus is not limited to the one having four processing units, and the number of processing units may be less than four or may be greater than four. Moreover, the number of the vacuum transport chambers may be less than two or may be greater than two. Furthermore, the apparatus is not limited to the one having two processing units connected to the vacuum transport chamber, and the number of the processing units may be less than two or may be greater than two. Note that, in this embodiment, the processing units 209a, 209b, 209C, and 209d are etching process units, respectively, for etching, in the internal processing chamber, a film layer to be processed of a multiple layer structure that is formed in advance in the upper surface of the wafer 213, and are referred to as EU1, EU2, EU3, and EU 4, respectively, for descriptive purposes.

Figure 3A:
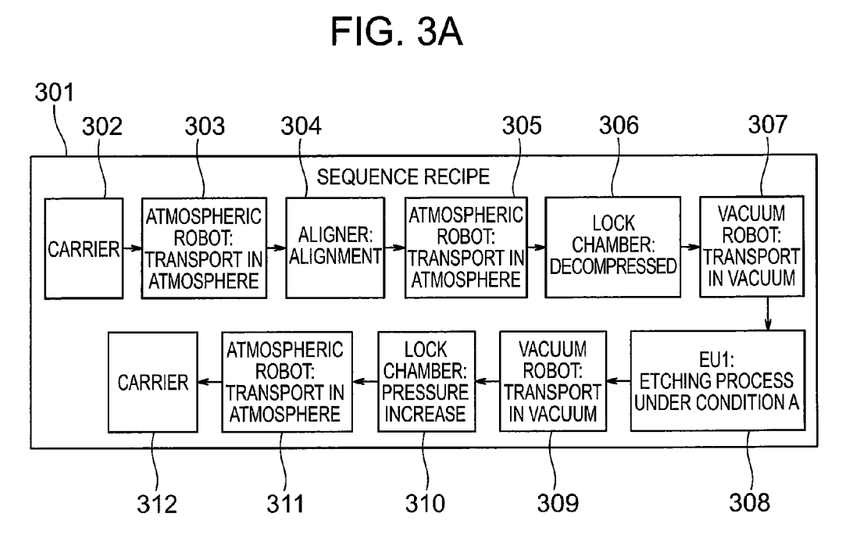
FIG. 3A is a view schematically showing a sequence recipe for setting a wafer transport path of the embodiment shown in FIG. 1.
Figure 3B:
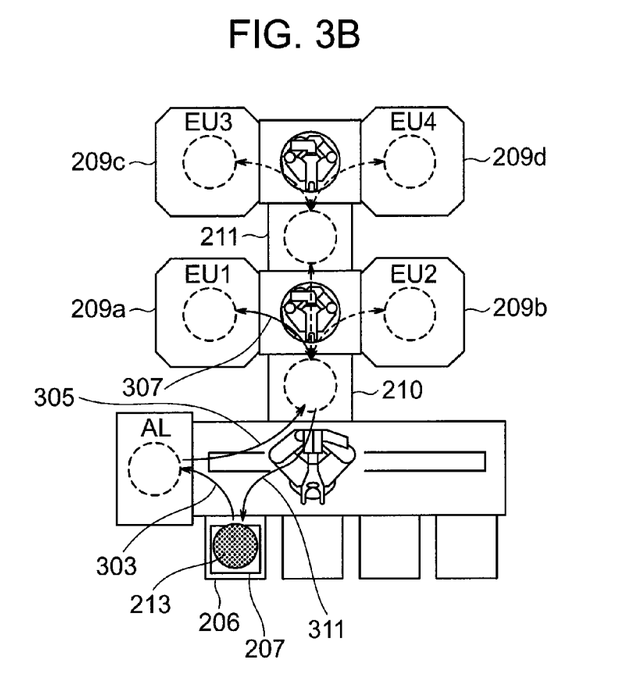
FIG. 3B is a view schematically illustrating a wafer transport path.

Next, the transport path information 114 for transporting the wafer 213 is described using FIGS. 3A and 3B. FIGS. 3A and 3B are views schematically illustrating a sequence recipe for setting a transport path of a wafer of the embodiment shown in FIG. 1 and the transport path, respectively. FIG. 3A is an example of the sequence recipe and FIG. 3B is a view showing a transport path inside the vacuum processing apparatus main body 101.

In this embodiment, the transport path information 114, as a sequence recipe 301, is information that is set in advance by a user, for each wafer 213 to be processed and is registered on the storage unit 107 inside the control unit 102, before processing. The transport path information 114 comprises: information about a transport path including stations, which any wafer 213 goes through after being carried out from the carrier 207, in which it is housed, and the any wafer 213 is transported to either one of the processing units 209a-d and processed and until it is transported again and brought back to an original location inside the original carrier 207 and about the order thereof; and information about the processing conditions in a target processing unit.

FIGS. 3A and 3B each show a setting example and schematically show the contents thereof as a view. In this example, the order of stations, in which the unprocessed wafer 213 carried out from any carrier 207 is then transported to, is set inside the sequence recipe 307 as follows. From a state 302 where the unprocessed wafer 213 is housed in the carrier 207, the unprocessed wafer 213 is carried out from the carrier 207 by the atmospheric robot 205 and is transported to the aligner 204 (303). After alignment 304 is performed by the aligner 204, the unprocessed wafer 213 is transported in atmosphere (305) from the aligner 204 to the lock chamber 210 and carried into the lock chamber 210 by the atmospheric robot 205. Subsequently, decompression (vent) 306 inside the lock chamber 210 is performed.

After the decompression is complete the wafer 213 is transported by the vacuum robot 212a from the lock chamber 210 to the processing unit 209a (EU1) through the inside of the vacuum transport chamber 208a (307). Thereafter, in EU1, an etching process 308 of the wafer 213 under a processing condition A is performed. After this process is complete, the processed wafer 213 is transported by the vacuum robot 212a from EU1 into the lock chamber 210 (309), and pressure increase (purge) 310 is performed inside the lock chamber 210.

Inside the mini-environment 203, the wafer 213 is taken out from the lock chamber 210 by the atmospheric robot 205 and is transported (311) and brought back to an original location of the original carrier 207 and housed therein (312). The vacuum processing apparatus main body 101 transports the wafer 213 in accordance with the transport order and path by way of each station in the sequence recipe set as shown in FIG. 3A. This path is indicated by an arrow on FIG. 3B, and each wafer 213 housed in a plurality of carriers 207 is transported along a path line indicated by an arrow.

Moreover, in the sequence recipe of FIG. 3A, together with the order of stations in a path through which any wafer 213 to be processed is transported, a time period of each sequence designated by each one of reference numerals 302 to 312 which each station corresponds to is set and registered as sequence information. In this time information, together with a time period (two time intervals) during which the wafer 213 actually stays in each station, a time period obtained by adding a predetermined time interval as a spare time to in front or after thereof is set and registered.

Moreover, in the sequence recipe of this embodiment, in the case where a station in which the wafer 213 stays is a processing unit, the condition of the processing of the wafer 213 performed in this processing unit is already set and registered, as a processing recipe, in this processing unit of this sequence recipe information. In FIG. 3A, the information about an etching condition of the wafer 213 in EU1 as information A is associated with the sequence information, which the station EU1 corresponds to, and is recorded in the storage unit 107.

The transport path information shown in this view is an example, and the present invention is not limited to this path, and two processing chambers may be specified or more processing chambers may be specified. Moreover, the path does not necessarily need to be one path, but a path may branch on the way or paths may join on the way. Moreover, in the example of this view, an example is shown, in which the processing unit 209a (EU1) coupled to the vacuum transport chamber 208a is a target place for transport, but needless to say that other processing units 209b, 209C, and 209d may be the target places for transport. For example, in the case where the processing units 209c and 209d are set to the target places for transport, the sequence recipe includes a sequence of: processing in a relevant processing unit; transport in vacuum of the wafer 213 between the lock chamber 210 and the intermediate chamber 211 by the vacuum robot 212a as shown by a dotted line arrow of FIG. 3B; standby in the intermediate chamber 211; and transport in vacuum between a target processing unit in the vacuum transport chamber 208b and the intermediate chamber 211.

Figure 4:
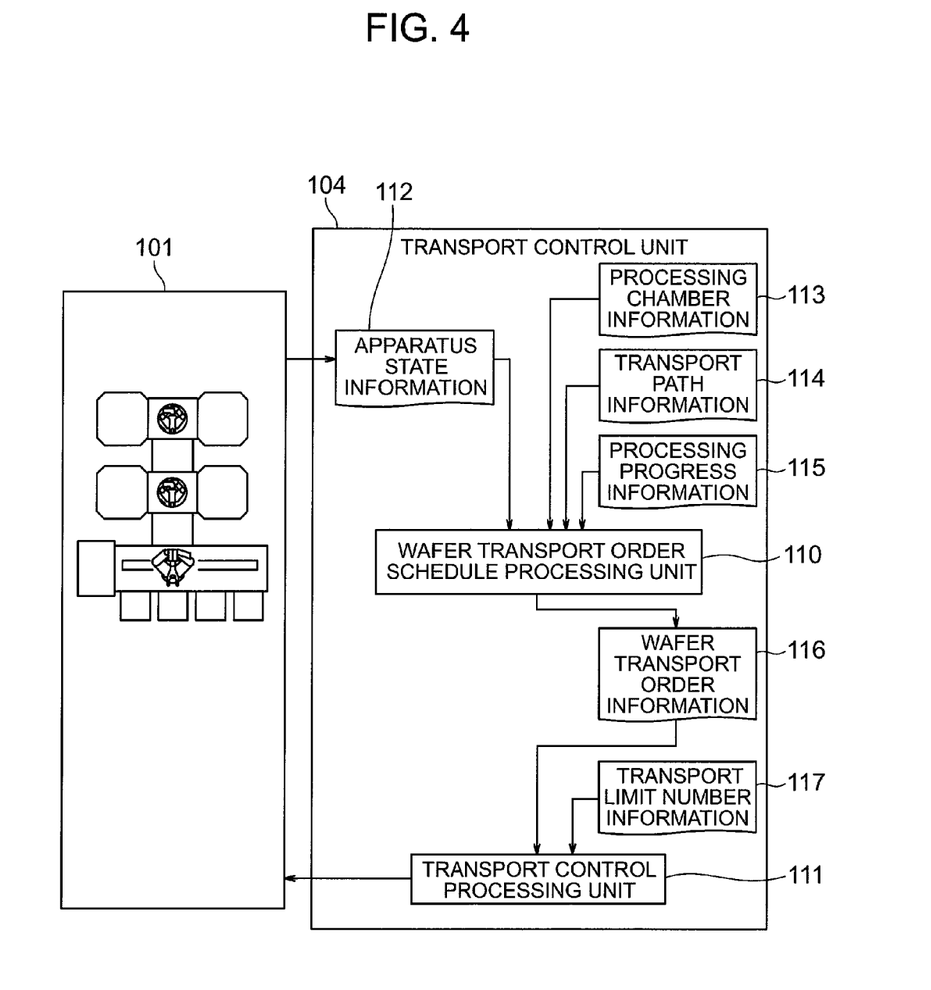
FIG. 4 is a schematic diagram showing a data flow in controlling the wafer transport of the embodiment shown in FIG. 1.

Next, a flow of wafer transport operations of the vacuum processing apparatus of the embodiment is described using FIG. 4. FIG. 4 is a schematic diagram showing a data flow in controlling the wafer transport of the embodiment shown in FIG. 1. This view shows a flow of data for software when the transport control processing unit 111 of the control unit 102 of the vacuum processing apparatus main body 101 calculates a command to transport.

The transport control unit 104 includes a calculation unit that performs processing and calculation in the wafer transport order schedule processing unit 110 and the transport control processing unit 111. The wafer transport order schedule processing unit 110 reads a software, which is stored in advance in the storage unit 107, via a communication unit, acquires, in accordance with an algorithm described in this software, the apparatus state information 112, the processing chamber information 113, the transport path information 114, and the processing progress information 115 stored in the storage unit 107, via a communication unit, and calculates the wafer transport order information 116 from these pieces of information. The calculated wafer transport order information 116 is transmitted, and is received by the transport control processing unit 111.

The transport control processing unit 111 calculates, based on a transport number limit included in the transport limit number information 117 stored in the storage unit 107 and the received wafer transport order information 116, a command signal to adjust the transport of the wafer 213 to the vacuum processing apparatus main body 101. This command signal is transmitted from the communication interface communicatively connected to the calculation unit 104, to a place to be controlled of the vacuum processing apparatus main body 101 via a communication unit.

Moreover, pieces of information included in each information are as follows. The apparatus state information 112 includes the states of operations of a plurality of parts of the vacuum processing apparatus main body, e.g., the information, such as an on/off state or a pressure value, which a signal output from a plurality of types of sensors arranged in these parts indicates. The processing chamber information 113 includes data indicative of a state and a processing status inside the processing chamber of the current processing unit. These pieces of information change with a progress of the operation in the vacuum processing apparatus main body 101 or a processing unit, and are updated at predetermined time intervals, and include previous data together with the latest data, and these data are separately stored as the apparatus state information 113 or the processing chamber information 114.

The transport path information 114 includes, as shown in FIGS. 3A and 3B, sequence information at each station including the transport path and order of the wafer 213.

The processing progress information 115, with regard to a lot that is a specific aggregate of the wafers 213 currently being processed in the vacuum processing apparatus main body 101, includes data indicative of the progress of processing in a relevant lot. As an example, the information indicative of the following is included: what number wafer is being processed in a predetermined processing order of wafers 213, or whether or not the relevant wafer is being taken out from the carrier 207, or which sequence in a corresponding sequence recipe is being performed, and the like at any time instant, in a case where a plurality of wafers 213, e.g., 25 wafers, are housed in the carrier 207 and information is acquired at predetermined time intervals.

Figure 6:
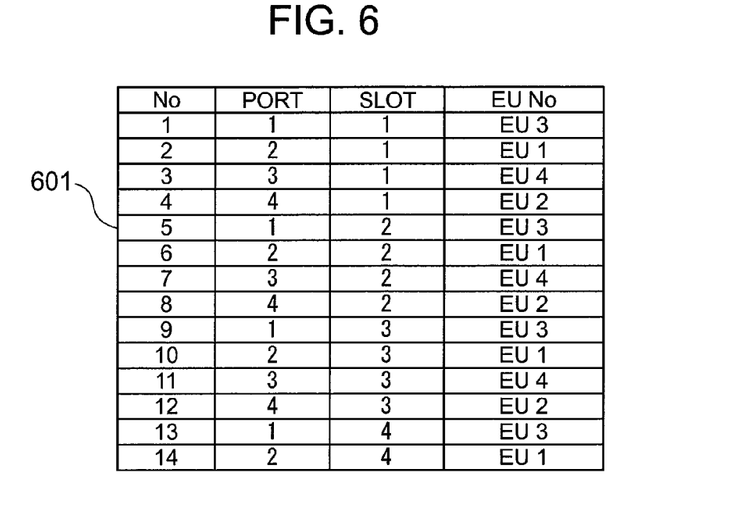
FIG. 6 is a table showing an example of wafer transport order information in the embodiment shown in FIG. 1.

The wafer transport order information 116 includes information indicative of a transport order for each of a plurality of wafers 213 housed in the carrier 207. This information, as shown in FIG. 6, is stored as a number indicative of the transport order of each wafer 213, a port number indicative of the load port 206, on which the carrier 207 having each wafer 213 housed therein is placed, a number indicative of a slot in the carrier 207, and an EU number (No.) of a processing unit in which each wafer 213 is processed.

In an example shown in FIG. 6, associated pieces of information are stored as a table or a list, as follows: as the wafer with No. 1 to be transported first on the order, the wafer 213 of Port 1 (in the carrier 207)/Slot 1 is transported to EU3; as the wafer with No. 2 to be transported second, the wafer 213 of Port 2/Slot 1 is transported to EU1; the wafer 213 of Port 3/Slot 1 is transported to EU 4; the wafer 213 of Port 4/Slot 1 is transported to EU2, and so on.

The transport limit number information 117 is information for restricting the number of wafers 213 currently being processed in a processing unit in the vacuum processing apparatus main body 101 of the embodiment and the number of wafers 213 currently being transported so as to be equal to or less than a certain number. This is information for avoiding a transport dead lock state, i.e., a state where if a large number of wafers 213 are being transported at the same time, then in attempting to transport a certain wafer 213, the certain wafer 213 cannot be moved because there are other wafers 213 at a transport destination. In this embodiment, using the transport limit number information 117, the possibility of carrying out of the wafer 213, which has not been carried out yet from the carrier 207, is determined.

Figure 5:
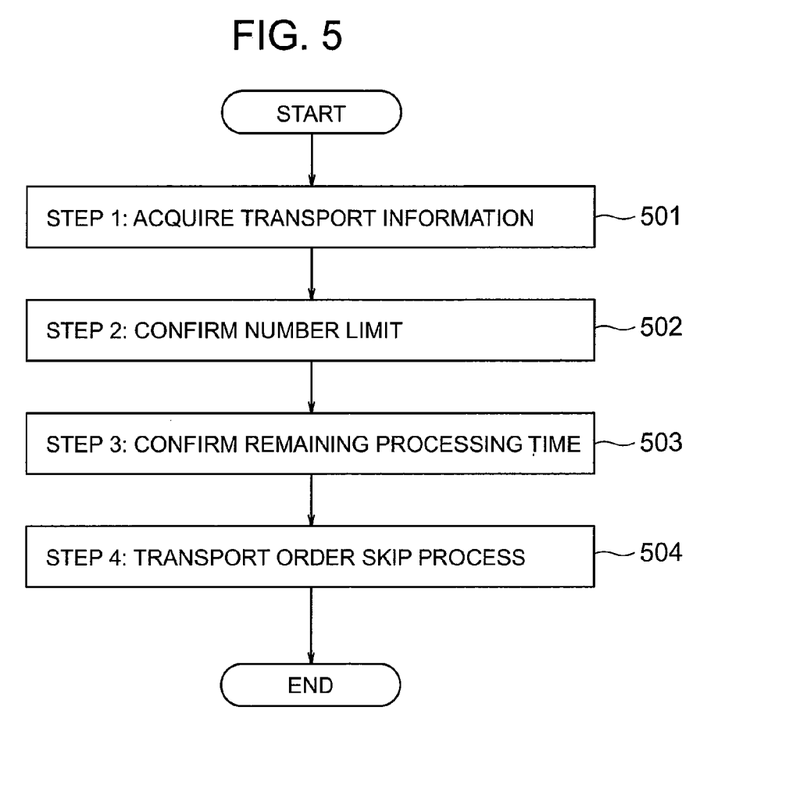
FIG. 5 is a view illustrating a flow of transport adjustment commanded by a transport processing unit of the embodiment shown in FIG. 1.

Next, a flow of calculations of the transport control processing unit 111 is described using FIG. 5. FIG. 5 is a view illustrating a flow of transport adjustment commanded by the transport control unit of the embodiment shown in FIG. 1. In particular, in this view, there is shown a flow of operations to determine the possibility of carrying out of the wafer 213 that has not carried out yet.

In this view, after starting to control transport, the transport control processing unit 111, in Step 1: transport information acquisition 501, using the wafer transport order information 116, detects, from an ascending order of transport order numbers, the wafer 213 to be started to be transported next for processing from the carrier 207. Furthermore, the EU number of either one of the processing units 209a, 209b, 209C, and 209d, in which the relevant wafer 213 is processed, is also detected.

Next, in Step 2: number limit confirmation 502, it is determined whether or not a wafer 213:$n$, which has been detected as the one to be transported nest, is restricted by a number limit. Specifically, based on the information acquired in Step 1, it is determined whether or not there is any wafer 213 currently being processed (at any time instant for each predetermined time interval at which determination is made) in a transport-destination processing unit of the wafer 213:$n$ scheduled to be transported next. Furthermore, it is determined whether or not there is any wafer 213, which is scheduled to be processed in a transport-destination processing unit and which is already started to be transported from the carrier 207, and then the number of these wafers is counted.

Furthermore, in Step 2, it is determined whether or not the counted value is equal to or greater than a predetermined value stored in the transport number limit information 117, and if it is determined the counted value is equal to or greater than a predetermined value, the transport control processing unit 111 will not transmit to the atmospheric robot 205 a command to transport the wafer 213:$n$. That is, the wafer 213:$n$ is not allowed to be carried out from the carrier 207.

Next, in Step 3: remaining processing time confirmation 503, in the case where there is other wafer 213 already being etched in a processing unit that is a transport destination of the wafer 213:$n$, which is already detected in Step 1 as being scheduled to be transported next, a remaining processing time of this wafer 213 is detected. The processing progress information 115 is used for the detection of this remaining time.

Furthermore, if there is any wafer 213 that is already started to be transported for processing, all the time periods of processes scheduled to be performed on the wafer 213 currently being transported are summed up and a sum of this result and the above-described remaining time is calculated. Then, it is determined whether or not the value of the time period obtained by this calculation is equal to or greater than a predetermined value. If it is determined as being equal to or greater than a predetermined value, the transport control processing unit 111 will not transmit to the atmospheric robot 205 a command to transport the wafer 213:$n$. That is, the wafer 213:$n$ is not allowed to be carried out from the carrier 207.

Next, in Step 4: transport order skip process 504, if it is determined, in Step 2: number limit confirmation 502 or in Step 3: remaining processing time confirmation 503, that the wafer 213:$n$ is not allowed to be carried out from the carrier 207, then data of the wafer 213 with an order number n+1 scheduled to be transported next and registered in the wafer transport order information 116 is acquired. Next, with regard to the next wafer 213:$n$+1, the same determination as in Step 2: transport number limit 502, i.e., determination of whether or not it has reached the number limit is performed, and furthermore, the same determination as in Step 3: remaining processing time confirmation 503, i.e., the detection of the remaining processing times of a transport-destination processing unit and the calculation of a sum thereof are performed.

As the results of determination in Steps 2, 3, the transport control processing unit 111, if it is determined that with regard to the next wafer 213:$n$+1, it has not reached the number limit, and moreover, if it determined that the sum of the remaining processing times has not exceeded the above-described predetermined value, transmits toward the atmospheric robot 205 a command to carry out from the carrier 207 the wafer 213:$n$+1 instead of the wafer 213:$n$ acquired in Step 1.

Figure 7A:
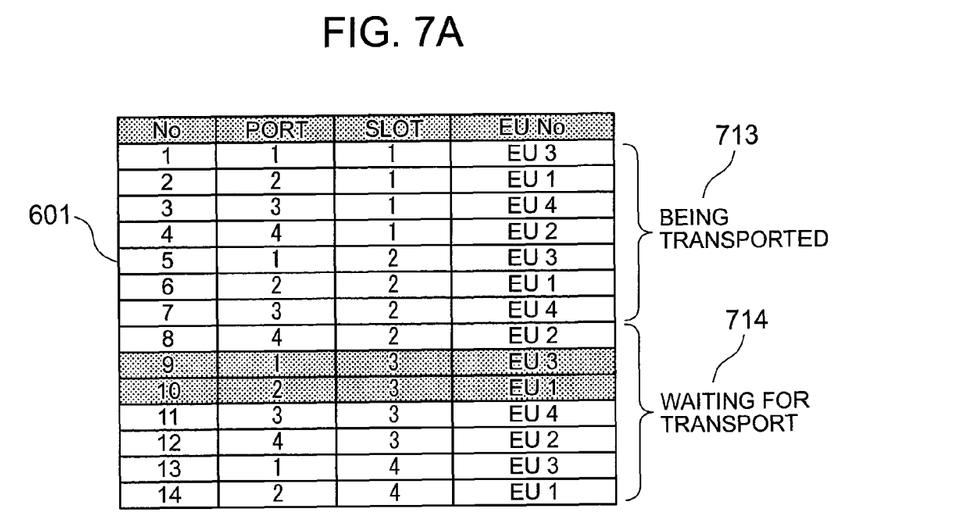
FIG. 7A is a view showing an example of wafer transport order information in the transport control shown in FIG. 5 of the embodiment shown in FIG. 1.
Figure 7B:
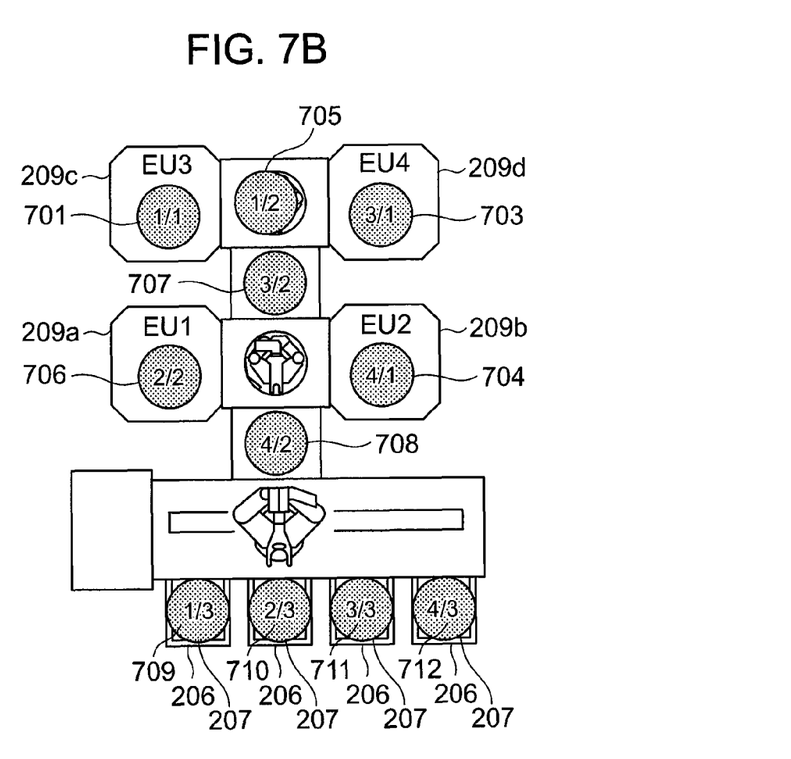
FIG. 7B is a view showing an operation example of the wafer transport control in FIG. 7A.

Next, a specific example of controlling the flow shown in FIG. 5 is described using FIG. 7. FIGS. 7A and 7B are views showing an operation example of the transport control shown in FIG. 5 of the embodiment shown in FIG. 1. In this view, there is shown an example, wherein the carrier 207 is arranged in each of four load ports 206 which the vacuum processing apparatus main body 101 includes, wherein a total number of housed wafers 213 is 14, and wherein the carrier 207 or load port 206 and the processing units 209a, 209b, 209C, and 209d are associated with each other so that among these carriers 207, the one arranged in Port 1 is etched in EU3, the one arranged in Port 2 is etched in EU1, the one arranged in Port 3 is etched in EU 4, and the one arranged in Port 4 is etched in EU2.

In this view, when the vacuum processing apparatus main body 101 starts an operation to process the wafer 213 in response to a command signal from the control unit 102, the wafer transport order schedule processing unit 110 of the transport control unit 104 generates wafer transport order information 601. In the wafer transport order information 601, with regard to a plurality of wafers 213 housed in a plurality of carriers 207, a transport order number and port number, a slot number in the carrier 207, and the EU number of a processing unit, in which the relevant wafer 213 is processed, are stored as a table or a list in which these are associated with each other. In this example, the followings are sequentially set: the wafer 213 with the smallest order number 1 to be transported first is in Slot 1 of Port 1, and this is transported to EU1; the wafer 213 with an order number 2 to be transported next is in Slot 1 of Port 2 and transported to EU1; and the wafer 213 with an order number 3 is in Slot 1 of Port 3 and transported to EU 4.

Based on the wafer transport order information 601, the transport control processing unit 111 calculates a command to transport the wafer 213 in Slot 1 of the first Port 1 to EU3 that is a processing unit, and the command signal is transmitted to the vacuum processing apparatus main body 101 from the control unit 102. Next, similarly, a command signal to transport the wafer 213 of Slot 1 of Port 2 to EU1 is transmitted to the vacuum processing apparatus main body 101. In response to the command signal, the vacuum processing apparatus main body 101 sequentially carries out each wafer 213 from the carrier 207 and transports the same to a corresponding processing unit, performs etching on each wafer 213 in each processing unit, and brings back the resulting each wafer 213 to the original location of the original carrier 207 after a predetermined processing is complete.

FIG. 7A shows a state where the transport of the wafer 213 from the carrier 207 has been sequentially performed and the transport of the wafers of NO. 1 to NO. 8 in the wafer transport order information 601 has been performed, i.e., a state where the wafers of NO. 1 to NO. 8 are currently being transported 713. Furthermore, as shown in FIG. 7B, in this state, with regard to the wafer 213 of NO. 9, a total of the number of wafers 213 currently being processed in the processing unit 209c (EU3) that is a scheduled transport destination and the number of wafers 213 already being transported is two, and therefore the transport control processing unit 111, in Step 2: transport number limit 502 shown in FIG. 5, determines that the wafer 213 of NO. 9 will not be carried out.

Therefore, at a time point when the above-described determination is made, the wafers 213 of No. 9 and thereafter are in a state of waiting for transport 714. Because the remaining processing time of the processing unit 209c (EU3) is the waiting time for transport of the wafer 213 of NO. 9, the longer the remaining processing time of EU3, the longer the state of waiting for transport 714 becomes, and as a result, the operation rate of the vacuum processing apparatus main body 101 decreases and a total efficiency of processing decreases.

Next, in Step 4 of FIG. 5: transport skip processing 504, with regard to the wafer 213 of No. 10 next to the wafer 213 of NO. 9 corresponding to the number limit, the determination of the transport order skip process 504 is made. Here, if a time period required for etching in the processing unit 209a (EU1) is short and the processing of the previous wafer 213 of NO. 2 is already complete, then with regard to EU1, in Step 2: transport number limit 502, it is not determined that the wafer 213 of No. 10 cannot be transported. Then, the transport control processing unit 111 determines that the wafer of NO. 10 can be transported earlier than the wafer 213 of NO. 9, and calculates a command to transport the relevant wafer 213, and a command signal from the control unit 102 is transmitted to the vacuum processing apparatus main body 101.

That is, in this embodiment, in a state where the vacuum processing apparatus main body 101 is operated with the transport of the wafer 213 being adjusted in accordance with the wafer transport order information 116 at any time instant, if it is determined in Steps 2, 3 shown in FIG. 5 that the wafer 213:n with an order number n scheduled to be carried out from the carrier 207 will not be transported, then the transport control processing unit 111, with respect to the wafer 213 scheduled to be transported hereinafter in the current wafer transport order information 116, sequentially makes the determinations shown in FIG. 5, and sets and registers the wafer 213 determined as being able to be transported first, in place of the above-mentioned wafer 213:n, as a wafer 213:n' to be transported next. Then, the vacuum processing apparatus main body 101 starts to transport this wafer 213:n' in response to a command signal from the control unit 102.

Furthermore, the wafer transport order schedule processing unit 110 of the calculation unit 106, with regard to a total of five remaining wafers 213, which have not being carried out yet from the carrier 207, including the wafer 213:n, based on the transport path information 114, newly calculates wafer transport order information 116'. The processing unit 102 including the transport control processing unit 111 transmits a command signal for the adjustment of transport of the remaining wafers 213 based on the wafer transport order information 116' and adjusts the transport operation of the vacuum processing apparatus main body 101. In the example of FIG. 7, with regard to the wafer 213 of NO. 8, the determination of the possibility of carrying out shown in FIG. 5, is made, but not limited thereto, the frequency and timing of the determination may be set in accordance with a request from a user and the specifications, such as the conditions of etching of the wafer 213. For example, after the first wafer 213 of a lot is transported, the possibility of transport may be determined prior to transporting each wafer 213, and then the wafer transport order information 116 may be re-configured, re-registered, and updated as required.

In this embodiment, with such operation, the idle time in the processing of the processing unit 209a is reduced, and a decrease in the operation rate as the whole vacuum processing apparatus main body 101 is suppressed.

Figure 8A:
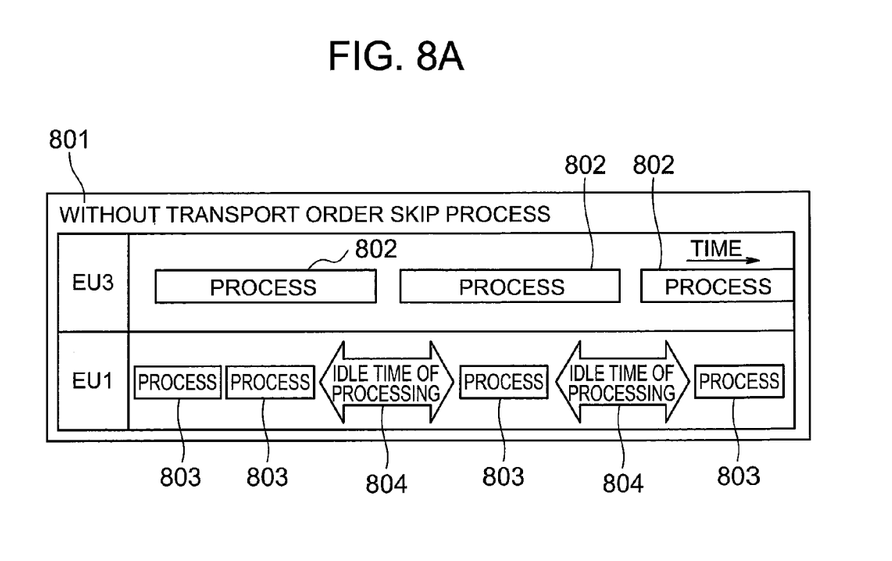
FIGS. 8A and 8B are views for comparing an idle time of the operation example shown in FIG. 7 with an idle time of an example of a related art.
Figure 8B:
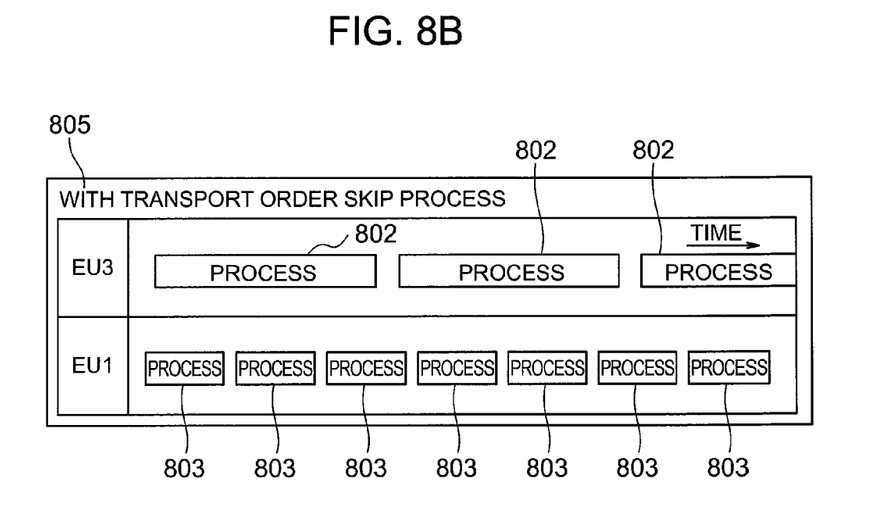

The effect in the example shown in FIGS. 7A and 7B is described using FIGS. 8A and 8B. FIGS. 8A and 8B are views for comparing the idle time between the operation example shown in FIG. 7 and an example of a related art, and are Gantt charts for comparing a case (FIG. 8B) where the transport order skip process 504 is performed and a case (FIG. 8A) where it is not performed. This Gantt chart expresses in blocks a processing state of each processing chamber, with the horizontal axis taken as time lapse.

In either of the case where the transport order skip process is not performed (801) or the case where the transport order skip process is performed (805), a case is assumed where a processing time at EU3 is relatively long and a processing time at EU1 is relatively short. In the case where the transport order skip process is not performed (801), if the processing 802 at EU3 is long, then when the transport number limit condition with regard to EU3 is not satisfied, the transport to EU1, which is scheduled to be performed after transport to EU3 in the wafer transport order information 601, becomes a standby state until the conditions are satisfied (until the processing at EU3 is complete, the number of wafers 213 currently being transported becomes below a limit value, and a total of the remaining processing times becomes below a predetermined value). Therefore, at EU1, an idle time of processing 804 occurs between processes 803 in a time scale, and the operation rate decreases.

In contrast, in the case where the transport order skip process 504 is performed (805), even if a processing time 802 at EU3 is long, the transport of the wafer 213 is skipped, which is determined as not satisfying the condition of the number limit or the remaining processing time and which is scheduled to be transported to EU3, and then the transport of the wafer 213 determined as satisfying the condition of the number limit and the remaining processing time is started, and the processing is performed with respect to the relevant wafer transported to EU1. With such operation, with regard to the idle time of processing 804 occurring in the case where the transport order skip process is not performed (809), the occurrence thereof is suppressed in the case where the transport order skip process is performed (805) and a decrease in the operation rate of EU1 is suppressed.

Figure 9A:
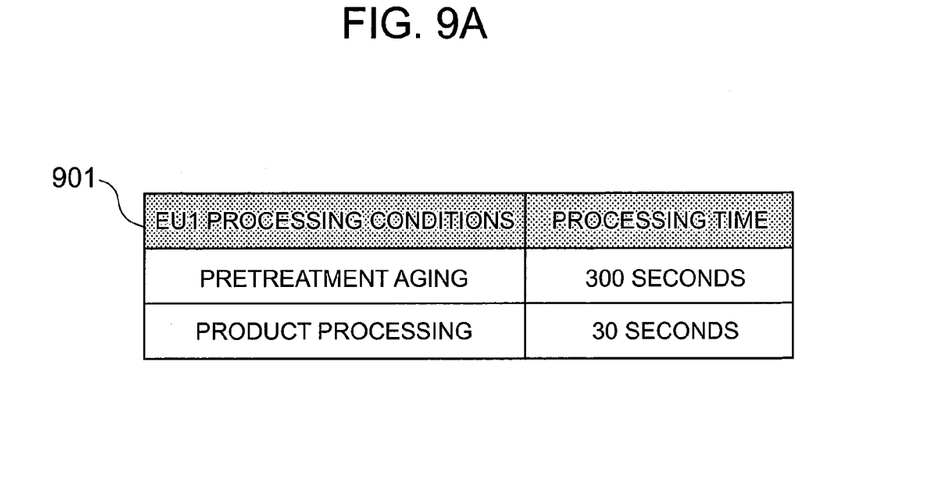
FIG. 9A is a view showing an example of processing conditions in a remaining processing time confirming step shown in FIG. 5 of the embodiment shown in FIG. 1.
Figure 9B:
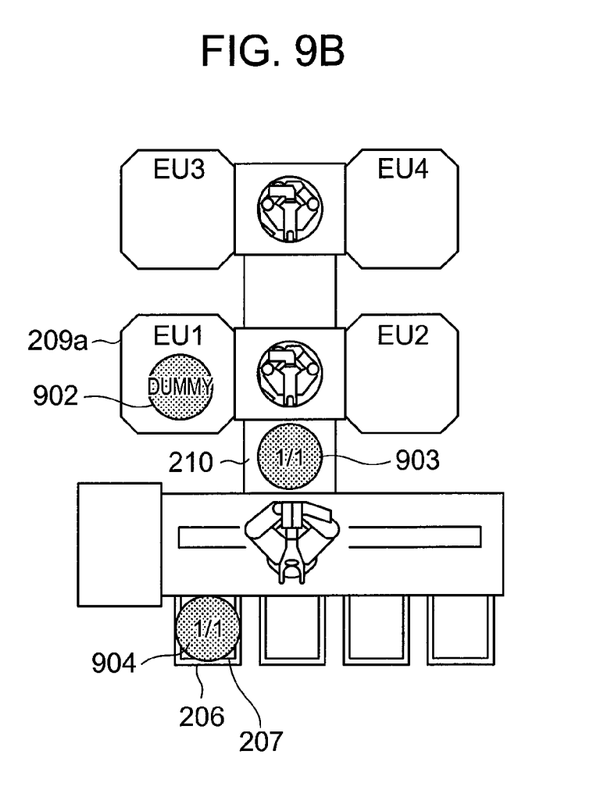
FIG. 9B is a view showing an operation example in the case of FIG. 9A.

Next, a more specific transport example in Step 3: remaining processing time confirmation 503 shown in FIG. 5 is described using FIGS. 9A and 9B. FIGS. 9A and 9B are a view (FIG. 9A) showing an example of the processing condition in the remaining processing time confirming step shown in FIG. 5 of the embodiment shown in FIG. 1 and a view (FIG. 9B) showing an operation example thereof.

A processing condition 901 of etching applied to the wafer 213 in this example includes 300 seconds of pretreatment aging process of a dummy wafer at the processing unit 209a (EU1) and 30 seconds of etching for subsequent product processing. When these processes are started, the vacuum processing apparatus main body 101 first carries out a dummy wafer 902 used for pretreatment aging, which is housed in either one carrier 207, from this carrier 207, and transports the same to the processing unit 209a (EU1), and performs the 300 seconds of etching.

Subsequently, the first product wafer 903 is transported and subjected to 30 seconds of etching for manufacturing a product. Next, the second product wafer 904 is transported and subjected to 30 seconds of etching. Likewise, the third and subsequent product wafers 213 are also similarly transported and subjected to etching.

In the case where other wafer 213 is already being processed in the processing unit 209a (EU1), the wafer 213 scheduled to be transported next to EU1 will stand by in the lock chamber 210. However, in the case where the processing time significantly differs between the pretreatment aging process and the product processing, as in this processing, the standby time varies for each wafer 213, and thus the unevenness of the time required for transport for each product wafer 213 will increase.

The vacuum processing apparatus main body 101 of this embodiment checks the remaining processing time in the processing unit 209a (EU1) by performing Step 3 shown in FIG. 5: remaining processing time confirmation 503, and will not carry out the product wafer from the carrier if the remaining processing time exceeds a certain time. Accordingly, the standby time in each wafer 213 will not exceed a certain time, and thus the evenness of the standby time across the wafers 213 can be maintained.

Figure 10A:
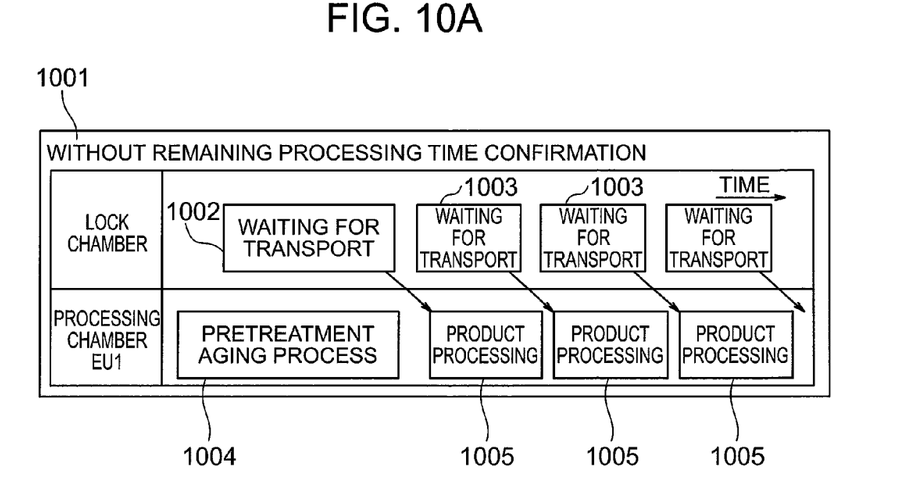
FIGS. 10A and 10B are views for comparing waiting times in cases with and without a remaining processing time confirming process.
Figure 10B:
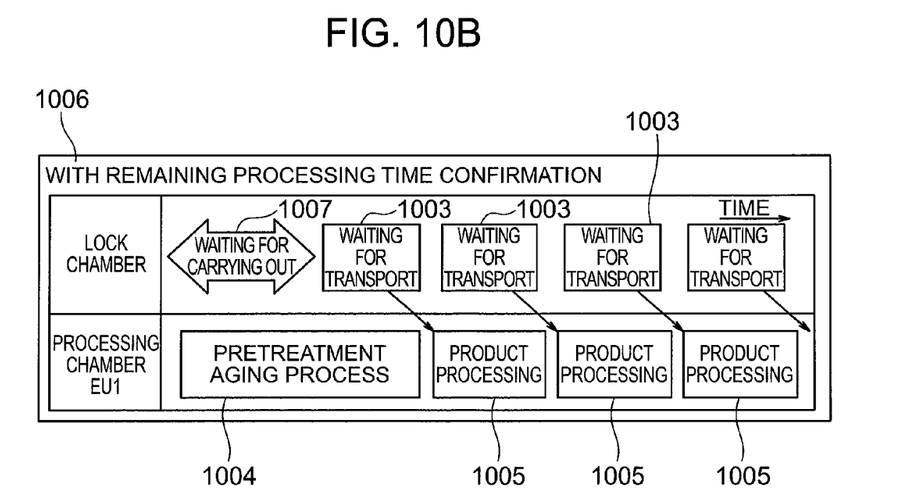

A specific effect of FIGS. 9A and 9B is described using FIGS. 10A and 10B. FIGS. 10A and 10B are views for comparing, by using Gantt charts, a case (FIG. 10A) where there is no Step 3: remaining processing time confirmation 503 in the embodiment shown in FIG. 1 and a case (FIG. 10B) where there is Step 3: remaining processing time confirmation 503. As with this view, in both a case 1001 where the remaining processing time confirmation 503 is not performed and a case 1006 where the remaining processing time confirmation 503 is performed, as shown in the processing condition 901 shown in FIG. 9A, 300 seconds of pretreatment aging and 30 seconds of product processing are assumed. Moreover, this view shows that while each wafer 213 is being processed in EU1, a waiting time is generated in the lock chamber 210.

When an attention is paid on this waiting time, in the case 1001 where the remaining processing time confirmation 503 is not performed, it can be seen that because the first product wafer 213 is already carried out from the carrier 207 while the pretreatment aging process is performed in EU1, the time for the first product wafer 213 to wait for transport 1002 is long and the time for the second and subsequent product wafers to wait for transport 1003 is short. In contrast, in the case 1006 where the remaining processing time confirmation is performed, the control unit 102 including the transport processing control unit 111, in the case where the first product wafer 213 is carried out from the carrier, as a result of performing the step of the remaining processing time confirmation 503 with respect to the wafer 213 scheduled to be transported next, will not transmit a command to carry out from the carrier 207 for a predetermined time. Thus, waiting for carrying out 1007 in the carrier 207 occurs, and after a certain time elapses, carrying out is started, and waiting for transport 1003 in the lock chamber occurs. Thus, in all the product wafers 213, unevenness of the waiting time in the lock chamber 210 is reduced.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method for operating a vacuum processing apparatus, the vacuum processing apparatus comprising: a plurality of cassette stands on which a cassette capable of housing a plurality of wafers therein can be placed; a plurality of vacuum processing vessels each having a processing chamber arranged therein, wherein the wafer is arranged and processed in the processing chamber; and at least one transport robot transporting the wafer on a transport path between either one of the plurality of cassettes and the plurality of vacuum processing vessels, the vacuum processing apparatus sequentially transporting in a predetermined transport order the plurality of wafers from either one of the plurality of cassettes to a predetermined one of the plurality of vacuum processing vessels and processing the plurality of wafers, the method comprising:

a number determining step of, before any one of the plurality of wafers is carried out from the cassette, determining whether or not a number of the wafers being present and currently being transported on the transport path between the cassette and one of the plurality of vacuum processing vessels, in which a relevant wafer is scheduled to be processed, is equal to or less than a predetermined value;

a remaining-time determining step of determining whether or not a total of a remaining processing time of the wafer being scheduled to be processed and being present in the one vacuum processing vessel and a processing time of the wafer being present and currently being transported on the transport path is equal to or less than a predetermined value; and a transport order skip step of, if a condition in the number determining step or in the remaining-time determining step is not satisfied, performing the number determining step and the remaining processing time determining step on the wafers after the any one wafer in accordance with the transport order, and newly specifying the wafer first satisfying the condition in these steps, as a wafer to be carried out from the cassette in place of the arbitrary one wafer, wherein the newly specified wafer is transported from the cassette, in which this wafer is housed, to the predetermined vacuum processing vessel and processed.

2. The method for operating a vacuum processing apparatus according to claim 1, further comprising a transport scheduling step of, after the transport order skip step, determining a transport order of wafers, which have not been carried out yet, among the plurality of wafers excluding the newly specified wafer.

3. The method for operating a vacuum processing apparatus according to claim 1, wherein each of the plurality of vacuum processing vessels as the predetermined transport destination of the plurality of wafers is associated with only either one of the plurality of cassettes.

4. The method for operating a vacuum processing apparatus according to claim 1, wherein the vacuum processing apparatus comprises:

a vacuum transport chamber, an inside of which is decompressed to a predetermined degree of vacuum and in the inside of which the wafer is transported and to which the vacuum processing vessel is coupled;

an atmospheric transport chamber, on a front side of which the plurality of cassette stands are arranged and in an inside of which set to an atmospheric pressure the wafer is transported;

a lock chamber capable of changing a pressure between a state at the atmospheric pressure and a decompressed state at the predetermined degree of vacuum, in a state where the lock chamber is communicatively coupled to the vacuum transport chamber and the atmospheric transport chamber and houses the wafer therein;

a vacuum robot being arranged inside the vacuum transport chamber and transporting the wafer; and an atmospheric robot being arranged inside the atmospheric transport chamber and transporting the wafer.

5. The method for operating a vacuum processing apparatus according to claim 1, wherein in the transport scheduling step, a transport order of the plurality of wafers is determined and also the vacuum transport vessel, in which these wafers are processed, is determined.

* * * * *